United States Patent
Wang et al.

(10) Patent No.: US 10,969,639 B2
(45) Date of Patent: Apr. 6, 2021

(54) ARRAY SUBSTRATE, DISPLAY PANEL AND DISPLAY DEVICE FOR IMPROVING ALIGNMENT DEFECTS

(71) Applicants: BOE TECHNOLOGY GROUP CO., LTD., Beijing (CN); Hefei Xinsheng Optoelectronics Technology Co., Ltd., Anhui (CN)

(72) Inventors: Wenhao Wang, Beijing (CN); Yanping Hong, Beijing (CN); Weijing Liao, Beijing (CN); Hui Jing, Beijing (CN); Defa Ruan, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 41 days.

(21) Appl. No.: 16/096,474

(22) PCT Filed: Mar. 20, 2018

(86) PCT No.: PCT/CN2018/079529
§ 371 (c)(1),
(2) Date: Oct. 25, 2018

(87) PCT Pub. No.: WO2018/171569
PCT Pub. Date: Sep. 27, 2018

(65) Prior Publication Data
US 2019/0137834 A1    May 9, 2019

(30) Foreign Application Priority Data
Mar. 23, 2017  (CN) .......................... 201720289589.0

(51) Int. Cl.
*G02F 1/1362*    (2006.01)
*G02F 1/1337*    (2006.01)
(Continued)

(52) U.S. Cl.
CPC ...... *G02F 1/136286* (2013.01); *G02F 1/1337* (2013.01); *G02F 1/133514* (2013.01);
(Continued)

(58) Field of Classification Search
CPC combination set(s) only.
See application file for complete search history.

(56) References Cited

U.S. PATENT DOCUMENTS

2012/0320320 A1* 12/2012 Chen ................ G02F 1/133707
349/106
2013/0120680 A1*  5/2013 Sun ....................... G02F 1/1368
349/43
(Continued)

FOREIGN PATENT DOCUMENTS

CN    102629045 A    8/2012
CN    102629056 A    8/2012
(Continued)

OTHER PUBLICATIONS

International Search Report dated Jun. 14, 2018 corresponding to application No. PCT/CN2018/079529.

*Primary Examiner* — Nduka E Ojeh
(74) *Attorney, Agent, or Firm* — Nath, Goldberg & Meyer; Joshua B. Goldberg

(57) ABSTRACT

Provided is an array substrate including gate lines, data lines, and a first alignment layer above a layer where the gate lines are located and a layer where the data lines are located, the gate lines and the data lines being arranged to intersect with each other to divide the array substrate into pixel regions. Each pixel region includes first and second sides (Continued)

opposite to each other and third and fourth sides opposite to each other, each of the first and second sides connecting the third side to the fourth side and extending in one direction, lengths of the first and second sides being greater than lengths of the third and fourth sides, the first alignment layer having a first alignment direction, and each of the first and second sides forming an acute angle with the first alignment direction. A display panel and a display device are also provided.

14 Claims, 3 Drawing Sheets

(51) Int. Cl.
  *G02F 1/1343* (2006.01)
  *H01L 27/12* (2006.01)
  *G02F 1/1335* (2006.01)
  *H01L 27/32* (2006.01)

(52) U.S. Cl.
  CPC .. *G02F 1/133784* (2013.01); *G02F 1/134309* (2013.01); *H01L 27/124* (2013.01); *H01L 27/3218* (2013.01); *G02F 1/134345* (2021.01); *G02F 2201/123* (2013.01); *H01L 27/3244* (2013.01)

(56) References Cited

U.S. PATENT DOCUMENTS

| | | | |
|---|---|---|---|
| 2013/0235315 A1* | 9/2013 | Ito | G02F 1/133784 349/126 |
| 2016/0033826 A1* | 2/2016 | Guo | G02F 1/133784 257/72 |
| 2017/0176829 A1* | 6/2017 | Son | G02F 1/136286 |
| 2017/0269441 A1* | 9/2017 | Murata | G02F 1/1368 |
| 2018/0239209 A1* | 8/2018 | Oka | G02F 1/136286 |

FOREIGN PATENT DOCUMENTS

| | | |
|---|---|---|
| CN | 103488011 A | 1/2014 |
| CN | 106125434 A | 11/2016 |
| CN | 206584146 U | 10/2017 |
| KR | 1020060114561 A | 11/2006 |

\* cited by examiner

ARRAY SUBSTRATE, DISPLAY PANEL AND DISPLAY DEVICE FOR IMPROVING ALIGNMENT DEFECTS

CROSS-REFERENCE TO RELATED APPLICATION

This is a National Phase Application filed under 35 U.S.C. 371 as a national stage of PCT/CN2018/079529, filed on Mar. 20, 2018, an application claiming the benefit of Chinese Patent Application No. 201720289589.0, filed on Mar. 23, 2017, the contents of which are incorporated herein by reference in the entirety.

TECHNICAL FIELD

The present application relates to the field of display technology, and particularly to an array substrate, a display panel and a display device.

BACKGROUND

In the manufacturing process of liquid crystal display devices, a rubbing process is required. The rubbing process refers to a process in which a surface of an alignment film on an array substrate and/or a color filter substrate is rubbed, in a certain direction and with certain strength, with a rubbing roller wrapped with a nylon or cotton cloth, thereby forming a groove which allows liquid crystals to be aligned with a pretilt angle. Since there is a level difference between pixel regions and inter-pixel regions of the display panel, an uneven wear of the rubbing roller may occur when the rubbing roller has been used for a long time.

SUMMARY

In an aspect, embodiments of the present disclosure provide an array substrate including a plurality of gate lines, a plurality of data lines, and a first alignment layer disposed above a layer where the gate lines are located and a layer where the data lines are located, the gate lines and the data lines being arranged to intersect with each other to divide the array substrate into a plurality of pixel regions. Each of the pixel regions includes a first side and a second side opposite to each other and a third side and a fourth side opposite to each other, each of the first side and the second side connecting the third side to the fourth side and extending in one direction, lengths of the first side and the second side being greater than lengths of the third side and the fourth side, the first alignment layer having a first alignment direction, and each of the first side and the second side forming an acute angle with the first alignment direction.

Optionally, the plurality of pixel regions are arrange in a plurality of rows, the gate lines extend in a row direction, and the first alignment direction is perpendicular to the row direction.

Optionally, an angle between at least one of the first side and the second side of the pixel region and the first alignment direction is in a range of about 10° to about 25°.

Optionally, an extending direction of a portion of each of the plurality of data lines between two adjacent pixel regions in a same row is substantially the same as an extending direction of at least one of the first side and the second side of the pixel region.

Optionally, each of the pixel regions is provided therein with a pixel electrode, and the pixel electrode includes at least two sub-electrode portions arranged along the first alignment direction, each of the sub-electrode portions being provided with a plurality of slits, and the slits of two adjacent sub-electrode portions of each of the pixel electrodes having different extending directions.

Optionally, an angle between the extending direction of the slits of each of the sub-electrode portions and the first alignment direction is identical.

Optionally, the angle between the extending direction of the slits of each of the sub-electrode portions and the first alignment direction is in a range of about 5° to about 20°.

In another aspect, the present disclosure further provides a display panel including an array substrate and a counter substrate arranged opposite to and aligned with the array substrate. The array substrate is the above array substrate according to the embodiments of the present disclosure, and the counter substrate includes a second alignment layer at a side of the counter substrate facing the array substrate, the second alignment layer having a second alignment direction which forms an acute angle with each of the first side and the second side of the pixel region.

Optionally, the plurality of pixel regions are arranged in a plurality of rows, and the counter substrate further includes color filter blocks arranged in one-to-one correspondence with the pixel regions, the color filter blocks having n colors, n being an integer greater than or equal to 3;

n adjacent color filter blocks in a same row have colors different from each other; and in n rows of color filter blocks arranged sequentially, n color filter blocks respectively from the n rows and having corresponding positions in respective rows have colors different from each other, the color filter blocks having corresponding position in respective rows being color filter blocks having a same sequence number in the n rows in a case where the color filter blocks in each of the n rows are numbered in a same direction.

In another aspect, the present disclosure further provides a display device including the above display panel according to the embodiments of the present disclosure.

BRIEF DESCRIPTION OF DRAWINGS

The accompanying drawings, which constitute a part of the specification, are provided for further understanding of the present disclosure, and for explaining the present disclosure along with the following specific implementations, but not intended to limit the present disclosure. In the drawings.

DETAILED DESCRIPTION

Specific embodiments of the present disclosure will be described in detail below in conjunction with the accompanying drawings. It is to be understood that the specific embodiments described herein are only to illustrate and explain the present disclosure and not intended to limit the present disclosure.

Figure 1:
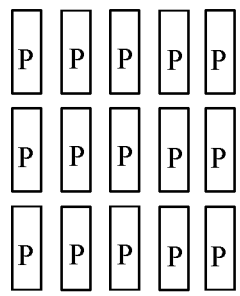
FIG. 1 is a schematic diagram illustrating a first arrangement of pixel regions in a conventional display panel.
Figure 2:
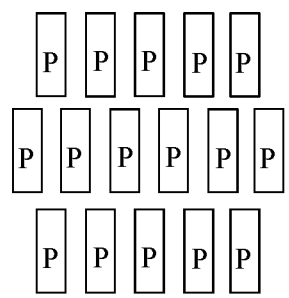
FIG. 2 is a schematic diagram illustrating a second arrangement of pixel regions in a conventional display panel.

FIGS. 1 and 2 are schematic diagrams illustrating two arrangements of pixel regions in a conventional display panel, and for an advanced super dimension switch (ADS) liquid crystal display panel, its alignment direction is a vertical direction in FIGS. 1 and 2. This will cause the follow problems. For a display panel in which the pixel regions are regularly arranged in a plurality of rows and a plurality of columns as shown in FIG. 1, when its array substrate or color filter substrate is rubbed for alignment, a portion of a rubbing roller almost always rubs the pixel regions P for alignment while the other portion of the rubbing roller always rubs inter-pixel regions between the pixel regions P for alignment, and since there is a level difference between pixel regions P and the inter-pixel regions of the substrate due to different structures of the pixel regions P and the inter-pixel regions, the portion of the rubbing roller corresponding to the pixel regions P and the portion of the rubbing roller corresponding to the inter-pixel regions are subjected to different forces, and therefore, after long-time rub for alignment, naps of a cloth on the rubbing roller have an uneven distribution in appearance, leading to an alignment defect during an alignment process. For a display panel in which the pixel regions are staggered as shown in FIG. 2, when its array substrate or color filter substrate is rubbed for alignment, a portion of a rubbing roller periodically contacts the pixel regions P and the inter-pixel regions, respectively, and the uniformity of the force applied to the alignment roller is slightly improved as compared to the case of the alignment of the display panel of FIG. 1, but it may adversely affect the alignment after prolonged use of the rubbing roller.

Figure 3:
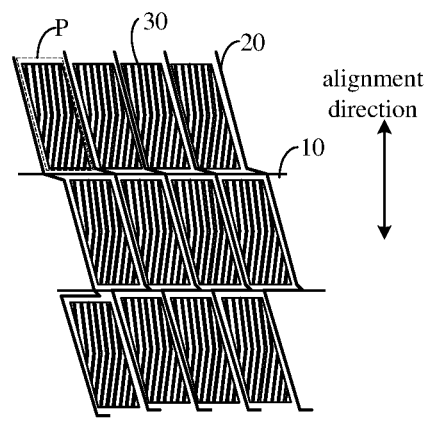
FIG. 3 is a schematic diagram illustrating a structure of an array substrate according to an embodiment of the present disclosure.
Figure 4:
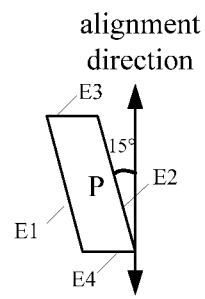
FIG. 4 illustrates a positional relationship between a pixel region in FIG. 3 and an alignment direction.

As an aspect of the present disclosure, there is provided an array substrate, and as illustrated in FIG. 3, the array substrate includes a plurality of gate lines 10, a plurality of data lines 20, and a first alignment layer (not shown) disposed above a layer where the gate lines 10 are located and a layer where the data lines 20 are located, and the gate lines 10 and the data lines 20 are arranged to intersect with each other to divide the array substrate into a plurality of pixel regions P. As illustrated in FIGS. 3 and 4, each pixel region P includes a first side E1 and a second side E2 opposite to each other and a third side E3 and a fourth side E4 opposite to each other, each of the first side E1 and the second side E2 connects the third side E3 to the fourth side E4 and extends in one direction, the lengths of the first side E1 and the second side E2 are greater than the lengths of the third side E3 and the fourth side E4, and each of the first side E1 and the second side E2 forms an acute angle with an alignment direction of the first alignment layer.

The pixel regions P may be provided therein with structures such as pixel electrodes 30, thin film transistors and the like, and a level difference is formed, in a thickness direction of the array substrate, between the pixel regions P and a region (that is, inter-pixel regions between the pixel regions P) where the data lines 20 and the gate lines 10 are located. Referring to FIGS. 1 and 2, in the conventional display panels, when a length direction or a width direction of the pixel regions P is identical to the alignment direction, during the rubbing process of the first alignment layer for alignment, a portion of the rubbing roller always contacts and rubs the pixel regions P while the other portion of the rubbing roller always contacts and rubs the inter-pixel region, which causes that the rubbing roller is subjected to the force unevenly. Even if the pixel regions in two adjacent rows are staggered, a portion of the rubbing roller periodically contacts the pixel regions and the inter-pixel regions, respectively, which causes that the rubbing roller is subjected to the force unevenly after prolonged alignment.

In the present disclosure, since the first side E1 and the second side E2 of the pixel region P form an acute angle with the alignment direction of the first alignment layer, when the first alignment layer of the array substrate is rubbed for alignment, the rubbing roller contacts the pixel regions P soon after the rubbing roller is in short contact with the inter-pixel regions, so that the rubbing roller is almost always in contact with the pixel regions P. Therefore, different regions of a surface of the rubbing roller are subjected to the force more uniformly, and the appearance of the surface naps is more uniform, thereby reducing the alignment detect after long-time use, and improving the quality of the display product.

The alignment direction of the first alignment layer may be along the length direction or the width direction of the array substrate. In some embodiments, as illustrated in FIG. 3, the plurality of pixel regions P are arranged in a plurality of rows, and the gate lines 10 extend in a row direction (specifically, the length direction of the array substrate), and the alignment direction of the first alignment layer is perpendicular to the row direction.

Specifically, an angle between at least one of the first side E1 and the second side E2 of the pixel region P and the alignment direction of the first alignment layer is in a range of about 10° to about 25°. In one example, as illustrated in FIG. 4, an angle between the second side E2 and the alignment direction of the first alignment layer is about 15°, thereby reducing the contact time of the rubbing roller with the inter-pixel region, while preventing the pixel region P from being too inclined to affect the display effect. In some embodiments, the first side E1 may be substantially parallel to the second side E2.

In addition, an extending direction of the data lines 20 generally coincides with the extending direction of the first side E1 and the second side E2 of the pixel region P. As illustrated in FIG. 3, the data lines 20 are generally inclined from the upper left side to the lower right side. For any one of the data lines 20, an extending direction of the portion of the data line 20 between two adjacent pixel regions P in a same row is substantially the same as the extending direction of the first side E1 and the second side E2 of the pixel region P. A portion of the data line 20 between two adjacent rows may have the same extending direction as that of the first side E1 and the second side E2 of the pixel region P such that the entire data line 20 is linear. Alternatively, as illustrated in FIG. 3, the portion of the data line 20 between two adjacent rows may have an extending direction different from that of the first side E1 and the second side E2 of the pixel region P, such that the data line 20 is bent, so two pixel regions P respectively from two adjacent rows and having corresponding positions in respective rows are staggered. Herein, two pixel regions P respectively from two adjacent rows and having corresponding positions in respective rows means that, when the pixel regions in each of the two adjacent rows of pixel regions are numbered in a same direction (for example, a direction from left to right in FIG. 3), the two pixel regions have a same sequence number.

Figure 5:
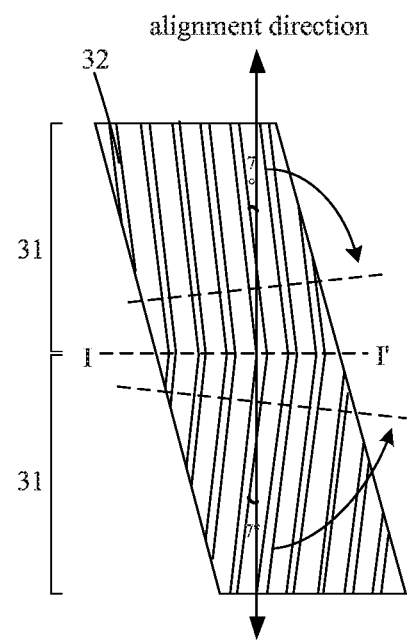
FIG. 5 is a schematic diagram illustrating a structure of a pixel electrode in FIG. 3.

Further, as illustrated in FIGS. 3 and 5, the pixel region P is provided therein with a pixel electrode 30, and the pixel electrode 30 includes at least two sub-electrode portions 31 (e.g., two sub-electrode portions 31 divided by a line I-I' in FIG. 5) arranged along the alignment direction of the first alignment layer. Each of the sub-electrode portions 31 is provided with a plurality of slits 32, and the slits 32 of two adjacent sub-electrode portions 31 in a same pixel electrode 30 have different extending directions. Optionally, an angle between the extending direction of the slits 32 of each of the sub-electrode portions 31 and the alignment direction of the first alignment layer is identical. As illustrated in FIG. 5, the pixel electrode 30 includes two sub-electrode portions 31, and respective slits 32 of the two sub-electrode portions 31 have different extending directions but have an identical angle relative to the alignment direction of the first alignment layer (FIG. 5 illustrates a case where an angle between the extending direction of the slits 32 of each of the two sub-electrode portions 31 and the alignment direction of the first alignment layer is about 7°). That is to say, the extending direction of the slits 32 of the upper sub-electrode portion 31 and the extending direction of the slits of the lower sub-electrode portion 31 are symmetrical (for example, with respect to the line I-I'), thereby forming a double domain structure. In a display panel having a single domain structure, a viewing direction when viewed from one side of the display panel is identical to a long-axis direction of liquid crystal molecules, while a viewing direction when viewed from the other side of the display panel is identical to a short-axis direction of liquid crystal molecules, so that the display panel have different display effects when viewed from different sides and a phenomenon of color cast occurs. As compared to the single domain structure, in a display panel adopting the double domain structure, the long-axis direction of the liquid crystal molecules is identical to the alignment direction in an initial state, and when it is powered on to display, the long-axis directions of the liquid crystal molecules corresponding to the two sub-electrode portions 31 are deflected along directions of the one-way arrows in FIG. 5, respectively, so when viewed from either side of the display panel, the viewing direction is identical to the long-axis direction of some of the liquid crystal molecules and also identical to the short-axis direction of the other ones of the liquid crystal molecules, thereby alleviating color cast.

In some embodiments, the angle between the extending direction of the slits 32 of each of the sub-electrode portions 31 and the alignment direction of the first alignment layer is in a range of about 5° to about 20°, so as to ensure that the liquid crystal molecules are disordered during the deflection and to improve the display effect. Particularly, the angle may be about 7°.

Figure 6:
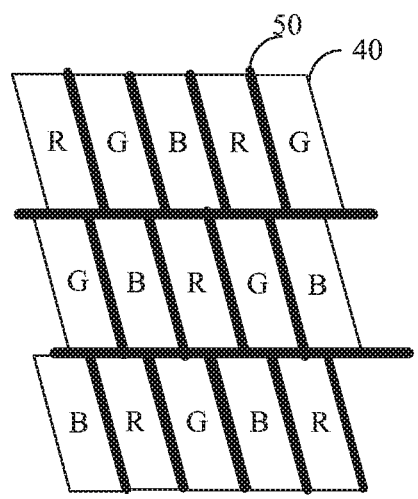
FIG. 6 is a schematic diagram illustrating a distribution of color filter blocks and a black matrix on a counter substrate according to an embodiment of the present disclosure.

As another aspect of the present disclosure, there is provided a display panel including the above array substrate according to the embodiments of the present disclosure and a counter substrate arranged opposite to and aligned with the array substrate. The counter substrate is provided with a second alignment layer on a side of the counter substrate facing the array substrate, and an alignment direction of the second alignment layer forms an acute angle with each of the first side E1 and the second side E2 of the pixel region P. The display panel according to the embodiments of the present disclosure is particularly suitable for products of the ADS mode and high opening rate ADS (H-ADS) mode, that is, the alignment direction of the second alignment layer is identical to the alignment direction of the first alignment layer. A black matrix 50 may be further disposed between the second alignment layer and the counter substrate. As illustrated in FIG. 6, the black matrix 50 corresponds to an inter-pixel region between every two adjacent pixel regions P to shield the gate lines 10 and the data lines 20 within the inter-pixel region.

Similar to the alignment process of the first alignment layer of the array substrate, although there is a level different between the portions of the counter substrate respectively corresponding to the pixel regions P and the inter-pixel regions in the thickness direction, since the second alignment layer forms an acute angle with each of the first side E1 and the second side E2 of the pixel region P, when the rubbing roller rubs the second alignment layer for alignment, the contact time of the rubbing roller with a portion of the second alignment layer corresponding to the inter-pixel regions is short, and the rubbing roller is almost always in contact with a portion of the second alignment layer corresponding to the pixel regions P, thereby improving the uniformity of the force applied to the rubbing roller and the alignment effect.

Further, as illustrated in FIG. 6, the counter substrate is further provided with color filter blocks 40 in one-to-one correspondence with the pixel regions P. The pixel regions P are arranged in a plurality of rows, and the color filter blocks are arranged in a plurality of rows accordingly. The color filter blocks 40 have n colors, where n is an integer greater than or equal to 3. In each row, n adjacent color filter blocks 40 have colors different from each other, and as illustrated in FIG. 6, the colors of the color filter blocks 40 include three colors of red (R), green (G), and blue (B), and the color filter blocks 40 of the three colors of red (R), green (G), and blue (B) are alternately arranged. To enlarge the color gamut of the display panel, among n rows of color filter blocks 40 that are sequentially arranged, n color filter blocks 40 respectively from the n rows and having corresponding positions in respective rows have colors different from each other. It should be noted that, the "corresponding positions" mean that, when the color filter blocks in each row are numbered in a same direction, the color filter blocks having corresponding position are color filter blocks having a same number (i.e., sequence number) in respective rows. For example, in first three rows, the i-th color filter block 40 from left to right (or, from right to left) in each row has a different color, where i is larger than zero and less than or equal to the number of pixel regions in each row.

As yet another aspect of the present disclosure, there is provided a display device including the display panel according to the embodiments of the present disclosure.

The above is a description of the array substrate, the display panel, and the display device according to the embodiments of the present disclosure. It can be seen that in the present disclosure, since the first side E1 and the second side E2 of the pixel region of the array substrate according to the embodiments of the present disclosure forms an acute angle with the alignment direction of the first alignment layer of the array substrate, when the first alignment layer of the array substrate is rubbed for alignment, the rubbing roller contact the pixel regions soon after the rubbing roller is in short contact with the inter-pixel regions, so that the rubbing roller is almost always in contact with the pixel regions. Therefore, different regions of a surface of the rubbing roller are subjected to the force more uniformly, and the appearance of the surface naps is more uniform, thereby reducing the alignment detect after long-time use, and improving the quality of the display product. Similarly, the alignment direction of the second alignment layer of the counter substrate also forms an acute angle with the first side E1 and the second side E2 of the pixel region, and when the second alignment layer of the array substrate is rubbed for alignment, different regions of the surface of the rubbing roller are subjected to the force more uniformly, thereby preventing the alignment detect after long-time use. In addition, the pixel electrode adopts the double domain structure to reduce the color cast, and the color filter blocks having corresponding positions in n sequentially-arranged rows of color filter blocks of the counter substrate have colors different from each other to enlarge the color gamut.

It can be understood that the foregoing embodiments are merely exemplary embodiments used for describing the principle of the present disclosure, but the present disclosure is not limited thereto. Those of ordinary skill in the art may make various variations and improvements without departing from the spirit and essence of the present invention, and these variations and improvements shall also fall into the protection scope of the present disclosure.

What is claimed is:

1. An array substrate, comprising a plurality of gate lines, a plurality of data lines, and a first alignment layer disposed above a layer where the gate lines are located and a layer where the data lines are located, the gate lines and the data lines being arranged to intersect with each other to divide the array substrate into a plurality of pixel regions in rows and columns, wherein each of the pixel regions comprises a first side, a second side opposite to the first side, a third side, and a fourth side opposite to the third side, each of the first side and the second side connects the third side to the fourth side, and both of the first side and the second side extend in one direction, lengths of the first side and the second side are greater than lengths of the third side and the fourth side, the first alignment layer has a first alignment direction, and for each of the pixel regions, an angle from each of the first side and the second side to the first alignment direction in a clockwise direction is an acute angle, and pixel regions adjacent in a column direction are staggered such that the first sides of the pixel regions adjacent in the column direction are non-collinear, and wherein each of the pixel regions is provided therein with a pixel electrode, and the pixel electrode comprises at least two sub-electrode portions arranged along the first alignment direction, each of the sub-electrode portions is provided with a plurality of slits and the slits of two adjacent sub-electrode portions of each of the pixel electrodes have different extending directions.

2. The array substrate of claim 1, wherein the plurality of pixel regions are arranged in a plurality of rows, the gate lines extend in a row direction, and the first alignment direction is perpendicular to the row direction.

3. The array substrate of claim 2, wherein an extending direction of a portion of each of the plurality of data lines between two adjacent pixel regions in a same row is substantially the same as an extending direction of at least one of the first side and the second side of the pixel region.

4. The array substrate of claim 1, wherein an angle between at least one of the first side and the second side of the pixel region and the first alignment direction is in a range of about 10° to about 25°.

5. The array substrate of claim 4, wherein an extending direction of a portion of each of the plurality of data lines between two adjacent pixel regions in a same row is substantially the same as an extending direction of at least one of the first side and the second side of the pixel region.

6. The array substrate of claim 1, wherein an extending direction of a portion of each of the plurality of data lines between two adjacent pixel regions in a same row is substantially the same as an extending direction of at least one of the first side and the second side of the pixel region.

7. The array substrate of claim 1, wherein an angle between the extending direction of the slits of each of the sub-electrode portions and the first alignment direction is identical.

8. The array substrate of claim 1, wherein an angle between the extending direction of the slits of each of the sub-electrode portions and the first alignment direction is in a range of about 5° to about 20°.

9. A display panel, comprising the array substrate of claim 1 and a counter substrate arranged opposite to and aligned with the array substrate, wherein the counter substrate comprises a second alignment layer at a side of the counter substrate facing the array substrate, and the second alignment layer has a second alignment direction forming an acute angle with each of the first side and the second side of the pixel region.

10. The display panel of claim 9, wherein the plurality of pixel regions are arranged in a plurality of rows, and the counter substrate further comprises color filter blocks arranged in one-to-one correspondence with the pixel regions, the color filter blocks including color filter blocks of n colors, n being an integer greater than or equal to 3, n adjacent color filter blocks in a same row have colors different from each other, and in n rows of color filter blocks arranged sequentially, n color filter blocks respectively from the n rows and having corresponding positions in respective rows have colors different from each other, the color filter blocks having corresponding position in respective rows being color filter blocks having a same sequence number in the n rows in a case where the color filter blocks in each of the n rows are numbered in a same direction.

11. A display device, comprising the display panel of claim 9.

12. A display device, comprising the display panel of claim 10.

13. The array substrate of claim 1, for each pixel region, angles between the extending directions of the slits of two adjacent sub-electrode portions of the pixel electrode in the pixel region and the first side of the pixel region are different.

14. An array substrate, comprising a plurality of gate lines, a plurality of data lines, and a first alignment layer disposed above a layer where the gate lines are located and a layer where the data lines are located, the gate lines and the data lines being arranged to intersect with each other to divide the array substrate into a plurality of pixel regions in rows and columns, wherein each of the pixel regions comprises a first side, a second side opposite to the first side, a third side, and a fourth side opposite to the third side, each of the first side and the second side connects the third side to the fourth side, and both of the first side and the second side extend in one direction, lengths of the first side and the second side are greater than lengths of the third side and the fourth side, the first alignment layer has a first alignment direction, and for each of the pixel regions, an angle from each of the first side and the second side to the first alignment direction in a clockwise direction is an acute angle, and wherein an extending direction of a portion of each of the plurality of data lines between two rows of pixel regions is different from the one direction in which the first side and the second side extend such that the data lines are bent, and one of the data lines between a first row of pixel regions and a second row of pixel regions is bent in a direction that is opposite to a direction in which one of the data lines between the second row of pixel regions and a third row of pixel regions is bent, the first row being adjacent to the second row, and the second row being adjacent to the third row.

\* \* \* \* \*